United States Patent
Cho et al.

(10) Patent No.: US 12,058,907 B2
(45) Date of Patent: Aug. 6, 2024

(54) METHOD OF MANUFACTURING DISPLAY APPARATUS HAVING SECOND ELECTRODE THAT CONTACTS SECOND CONDUCTIVE LAYER

(71) Applicant: SAMSUNG DISPLAY CO., LTD., Yongin-si (KR)

(72) Inventors: Hyun Min Cho, Hwaseong-si (KR); Tae Wook Kang, Seongnam-si (KR); Sang Gun Choi, Suwon-si (KR); Shin Il Choi, Hwaseong-si (KR); Yun Jung Oh, Anyang-si (KR); Myoung Geun Cha, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/158,320

(22) Filed: Jan. 23, 2023

(65) Prior Publication Data

US 2023/0165089 A1 May 25, 2023

Related U.S. Application Data

(62) Division of application No. 17/079,278, filed on Oct. 23, 2020, now Pat. No. 11,563,074.

(30) Foreign Application Priority Data

Dec. 31, 2019 (KR) .................. 10-2019-0179168

(51) Int. Cl.
*H01L 29/08* (2006.01)
*H10K 50/824* (2023.01)
(Continued)

(52) U.S. Cl.
CPC ......... *H10K 59/131* (2023.02); *H10K 50/824* (2023.02); *H10K 59/1213* (2023.02); *H10K 59/124* (2023.02); *H10K 71/00* (2023.02)

(58) Field of Classification Search
CPC ............ H10K 59/1213; H10K 59/131; H10K 59/124; H10K 71/00; H10K 50/824
(Continued)

(56) References Cited

U.S. PATENT DOCUMENTS

2017/0287994 A1   10/2017  Senda et al.
2018/0145119 A1   5/2018   Choi et al.
(Continued)

FOREIGN PATENT DOCUMENTS

CN   110690365 A  *  1/2020  ........... H01L 27/323
KR   10-0590259 B1    6/2006
(Continued)

OTHER PUBLICATIONS

Hwang, Chul Joo, "ALD (Atomic Layer Deposition) Process Technology in the Semiconductor Industry," Physics & High Technology, 2012, pp. 37-41.

*Primary Examiner* — Phuc T Dang
(74) *Attorney, Agent, or Firm* — Lewis Roca Rothgerber Christie LLP

(57) ABSTRACT

A display apparatus includes: a base substrate; a thin film transistor and a power supply wire on the base substrate; a first electrode on the base substrate, and electrically connected to the thin film transistor; a light emitting layer and a common layer on the first electrode; and a second electrode on the common layer. The power supply wire includes: a first conductive layer; a second conductive layer on the first conductive layer; and a third conductive layer on the second conductive layer. The third conductive layer protrudes more than the second conductive layer on a side surface of the power supply wire, and the second electrode contacts a side surface of the second conductive layer.

7 Claims, 19 Drawing Sheets

(51) Int. Cl.
  *H10K 59/121*  (2023.01)
  *H10K 59/124*  (2023.01)
  *H10K 59/131*  (2023.01)
  *H10K 71/00*   (2023.01)

(58) Field of Classification Search
  USPC .......................................................... 257/40
  See application file for complete search history.

(56) References Cited

U.S. PATENT DOCUMENTS

2018/0358572 A1  12/2018  Harada et al.
2020/0044001 A1   2/2020  Lim et al.

FOREIGN PATENT DOCUMENTS

| KR | 10-1131298 B1     | 3/2012  |
| KR | 10-2016-0062646 A | 6/2016  |
| KR | 10-2018-0107414 A | 10/2018 |

\* cited by examiner

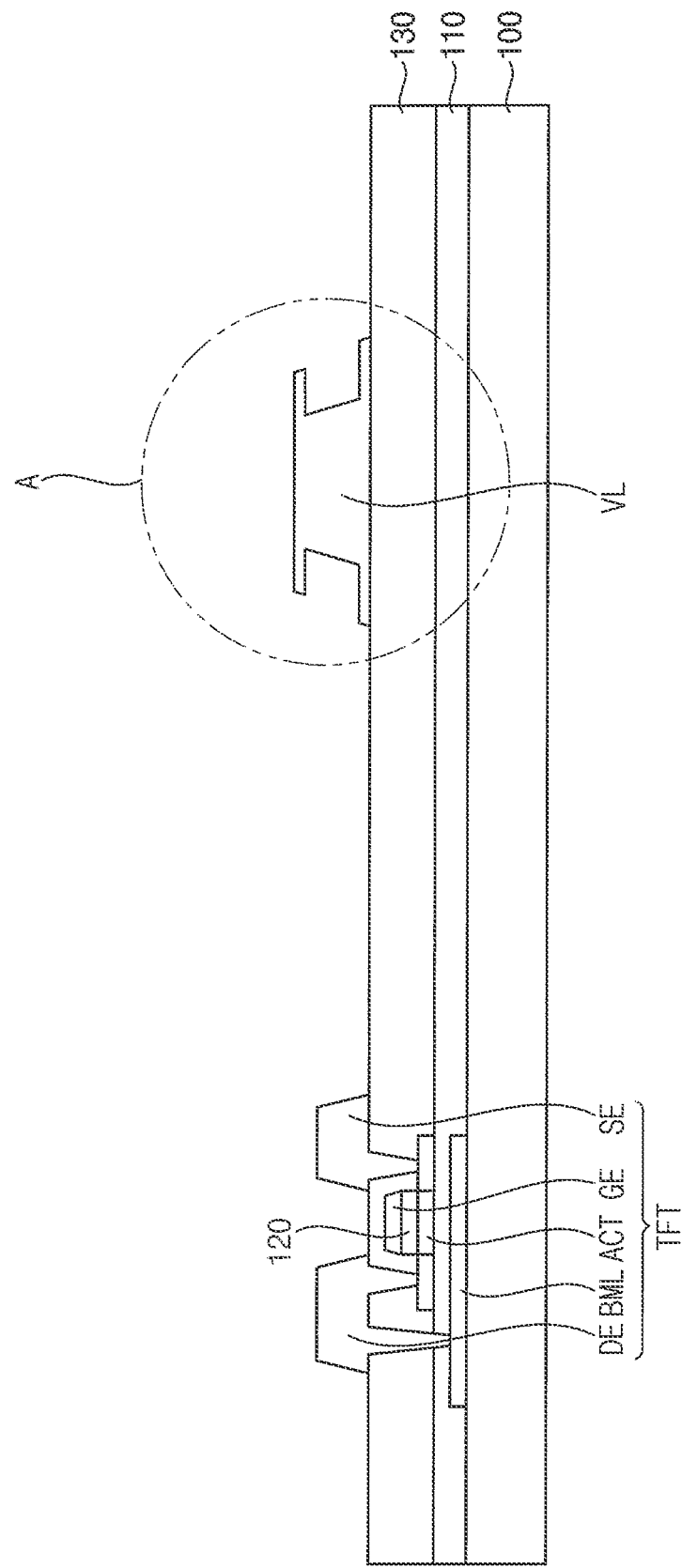

METHOD OF MANUFACTURING DISPLAY APPARATUS HAVING SECOND ELECTRODE THAT CONTACTS SECOND CONDUCTIVE LAYER

CROSS-REFERENCE TO RELATED APPLICATIONS

This application is a divisional of U.S. patent application Ser. No. 17/079,278, filed Oct. 23, 2020, now patent Ser. No. 11/563,074, which claims priority to and the benefit of Korean Patent Application No. 10-2019-0179168, filed Dec. 31, 2019, the entire content of both of which is incorporated herein by reference.

BACKGROUND

1. Field

Aspects of example embodiments of the present disclosure relate generally to a display apparatus, and a method of manufacturing the display apparatus. More particularly, aspects of example embodiments of the present disclosure relate to a display apparatus with improved display quality, and a method of manufacturing the display apparatus.

2. Description of the Related Art

Recently, as display technology improves, display products having smaller sizes, lighter weights, and superior performance have been produced. Cathode ray tube (CRT) televisions have been widely used for display apparatuses with many desirable characteristics in terms of performance and price. Recently, however, a display apparatus such as a plasma display apparatus, a liquid crystal display apparatus, and an organic light emitting diode display apparatus that overcomes weak points of the CRT in terms of miniaturization and/or portability, and having light weight and low power consumption, has been spotlighted.

The organic light emitting diode display apparatus may include a first electrode that is an anode electrode, a second electrode that is a cathode electrode, and a light emitting layer disposed between the first and second electrodes. In this case, as the organic light emitting diode display apparatus becomes larger, display quality may deteriorate due to an IR drop of the second electrode.

The above information disclosed in this Background section is for enhancement of understanding of the background of the present disclosure, and therefore, it may contain information that does not constitute prior art.

SUMMARY

One or more example embodiments of the present disclosure are directed to a display apparatus capable of preventing or reducing an IR drop of a cathode electrode to improve display quality while reducing a manufacturing cost.

One or more example embodiments of the present disclosure are directed to a method of manufacturing the display apparatus.

According to one or more example embodiments of the present disclosure, a display apparatus includes: a base substrate; a thin film transistor and a power supply wire on the base substrate; a first electrode on the base substrate, and electrically connected to the thin film transistor; a light emitting layer and a common layer on the first electrode; and a second electrode on the common layer. The power supply wire includes: a first conductive layer; a second conductive layer on the first conductive layer; and a third conductive layer on the second conductive layer. The third conductive layer protrudes more than the second conductive layer on a side surface of the power supply wire, and the second electrode contacts a side surface of the second conductive layer.

In some embodiments, the common layer may contact the side surface of the second conductive layer.

In some embodiments, a first cover part including a same material as that of the common layer may be on the third conductive layer of the power supply wire, a second cover part including a same material as that of the second electrode may be on the first cover part which may be on the third conductive layer, and the second cover part on the third conductive layer may be spaced from the second electrode which may be connected to the side surface of the second conductive layer.

In some embodiments, the common layer may include a hole injection layer and a hole transport layer between the first electrode and the light emitting layer, and an electron transport layer and an electron injection layer between the light emitting layer and the second electrode.

In some embodiments, the display apparatus may further include: a lower blocking electrode between the base substrate and the thin film transistor, and the lower blocking electrode and the power supply wire may be at a same layer.

In some embodiments, the thin film transistor may include a gate electrode, and the power supply wire may be at a same layer as that of the gate electrode.

In some embodiments, the power supply wire may extend in a first direction from a display area for displaying an image to a peripheral area, the peripheral area being a non-display area adjacent to the display area.

In some embodiments, the side surface of the second conductive layer of the power supply wire may include a first side surface and a second side surface opposite to the first side surface, and when measured in a length direction crossing a width direction of the power supply wire in a cross section extending through the first side surface and the second side surface, a contact length of a portion of the second electrode contacting the first side surface of the second conductive layer may be greater than a contact length of a portion of the second electrode contacting the second side surface of the second conductive layer.

In some embodiments, the power supply wire may extend in a first direction, the power supply wire may include a contact part protruding in a second direction crossing the first direction, and the second electrode may contact the side surface of the second conductive layer in the contact part.

In some embodiments, the contact part may have a semi-circular shape in a plan view.

In some embodiments, the second conductive layer of the power supply wire may include aluminum or copper.

According to one or more example embodiments of the present disclosure, a display apparatus includes: a base substrate; a first electrode on the base substrate; a common layer on the first electrode; a second electrode on the common layer; and a power supply wire on the base substrate. The power supply wire includes a recessed part at a side surface of the power supply wire in a longitudinal sectional view of the power supply wire, and the second electrode contacts the side surface of the power supply wire at the recessed part of the power supply wire.

In some embodiments, the common layer may contact the side surface of the power supply wire.

According to one or more example embodiments of the present disclosure, a method of manufacturing a display apparatus, includes: sequentially forming a first conductive layer, a second conductive layer, and a third conductive layer on a base substrate; forming a power supply wire by patterning the third conductive layer, the second conductive layer, and the first conductive layer; forming a via insulating layer on the base substrate on which the power supply wire is formed; forming a first electrode on the via insulating layer; forming a common layer on the base substrate on which the first electrode is formed; and forming a second electrode on the common layer. The third conductive layer protrudes more than the second conductive layer at a side surface of the power supply wire, and when the second electrode is formed, the second electrode contacts a side surface of the second conductive layer.

In some embodiments, the first conductive layer may include titanium, the second conductive layer may include aluminum, and the third conductive layer may include titanium, and when the power supply wire is formed, the first to third conductive layers may be patterned through dry etching to form an undercut.

In some embodiments, the first conductive layer may include titanium, the second conductive layer may include aluminum, and the third conductive layer may include titanium, and when the first electrode is formed, the first electrode may be patterned through wet etching, and a portion of the second conductive layer may be etched to form an undercut at side surfaces of the third conductive layer and the second conductive layer.

In some embodiments, the first conductive layer may include titanium, the second conductive layer may include copper, and the third conductive layer may include titanium, and when the power supply wire is formed, the first to third conductive layers may be patterned through wet etching to form an undercut at side surfaces of the third conductive layer and the second conductive layer.

In some embodiments, when the second electrode is formed, the second electrode may be formed by depositing a conductive material in a direction inclined at an angle with respect to a direction perpendicular to the base substrate.

In some embodiments, the common layer may contact the side surface of the second conductive layer.

In some embodiments, the common layer may include a hole injection layer, a hole transport layer, an electron transport layer, and an electron injection layer, and the method may further include forming a light emitting layer on the hole transport layer to overlap with the first electrode before forming the electron transport layer of the common layer.

A display apparatus according to one or more example embodiments of the present disclosure may include a base substrate, and a thin film transistor and a power supply wire, which may be disposed on the base substrate. A first electrode may be disposed on the base substrate, and may be electrically connected to the thin film transistor. A light emitting layer and a common layer may be disposed on the first electrode, and a second electrode may be disposed on the common layer. The power supply wire may include a first conductive layer, a second conductive layer disposed on the first conductive layer, and a third conductive layer disposed on the second conductive layer. The third conductive layer may protrude more than a side surface of the second conductive layer to form an undercut. The second electrode may contact (e.g., directly contact) the side surface of the second conductive layer. Accordingly, in the display apparatus, the power supply wire, which may be an auxiliary wire, may be connected to the second electrode without a separate laser drilling process or a separate photo-process using a mask, so that a display apparatus capable of preventing or reducing the IR drop while reducing manufacturing costs, and having a simplified structure may be provided.

BRIEF DESCRIPTION OF THE DRAWINGS

The above and other aspects and features of the present disclosure will become more apparent to those skilled in the art from the following detailed description of the example embodiments with reference to the accompanying drawings

FIGS. 10A, 10B, 11A, 11B, 12, 13A, 13B, 14A, 14B, 15A, and 15B are cross-sectional views illustrating a method of manufacturing a display apparatus according to one or more example embodiments.

DETAILED DESCRIPTION

Figure 1:
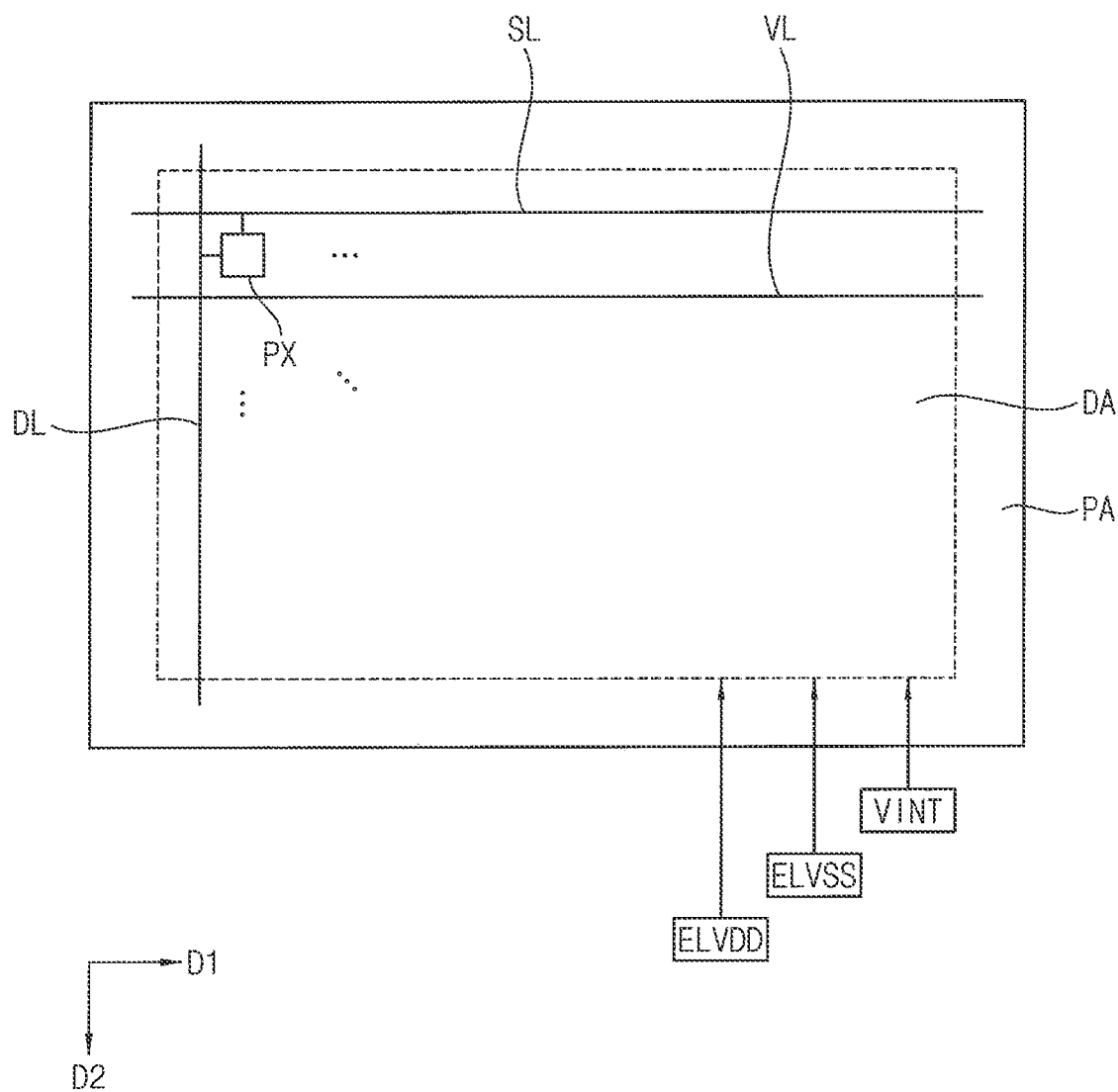
FIG. 1 is a plan view showing a display apparatus according to one or more example embodiments.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a plan view showing a display apparatus according to one or more example embodiments.

Referring to FIG. 1, a display apparatus may include a display area DA and a peripheral area PA.

A plurality of pixels PX for displaying an image may be disposed at (e.g., in or on) the display area DA. The pixels PX may be arranged in a matrix form in a first direction D1 and in a second direction D2 crossing (e.g., perpendicular to or substantially perpendicular to) the first direction D1. Each of the pixels PX may include a thin film transistor and a light emitting structure. The light emitting structure may include a first electrode electrically connected to the thin film transistor, a light emitting layer disposed on the first electrode, and a second electrode disposed on the light emitting layer.

The display apparatus may include a plurality of scan lines SL electrically connected to the pixels PX to apply a scan signal thereto, and a plurality of data lines DL electrically connected to the pixels PX to apply a data signal thereto.

The display apparatus may further include a plurality of power supply wires VL. The power supply wire VL may extend in the first direction D1, and may be disposed at (e.g., in or on) the display area DA. Although only one power supply wire VL is shown in FIG. 1, a plurality of power supply wires VL may be arranged along the second direction D2, and each of the power supply wires VL may extend in the first direction D1, but the present disclosure is not limited thereto.

In this case, in order to drive the pixel PX, a first power supply voltage ELVDD, a second power supply voltage ELVSS, an initialization voltage VINT, and/or the like may be applied to the pixel PX. For example, the second power supply voltage ELVSS may be applied to the power supply wire VL.

The peripheral area PA may be a non-display area at (e.g., in or on) which an image is not displayed, and may be adjacent to the display area DA to surround (e.g., around a periphery of) the display area DA. A driving circuit for driving the display apparatus and/or an inspection circuit for inspecting the display apparatus may be disposed at (e.g., in or on) the peripheral area PA. For example, the power supply wire VL may extend in the first direction D1 from the display area DA for displaying an image to the peripheral area PA corresponding to the non-display area adjacent to the display area DA, and may be connected to a test pad formed at (e.g., in or on) the peripheral area PA.

Generally, when a large organic light emitting diode display apparatus, for example, such as a television, has a front light emitting structure, a display quality may deteriorate due to an IR drop of a second electrode, which is a cathode electrode, and an auxiliary wire may be formed in order to prevent or reduce such IR drop. In this case, a separate laser drilling process, a separate contact hole forming process using a mask, and/or the like may be additionally performed to electrically connect the auxiliary wire to the cathode electrode.

According to one or more example embodiments of the present disclosure, the power supply wire VL, which may be the auxiliary wire, may be connected to the second electrode without performing the separate laser drilling process or a separate photo-process using a mask, so that a display apparatus capable of preventing or reducing the IR drop while reducing a manufacturing cost, and having a simplified structure may be provided.

Figure 2:
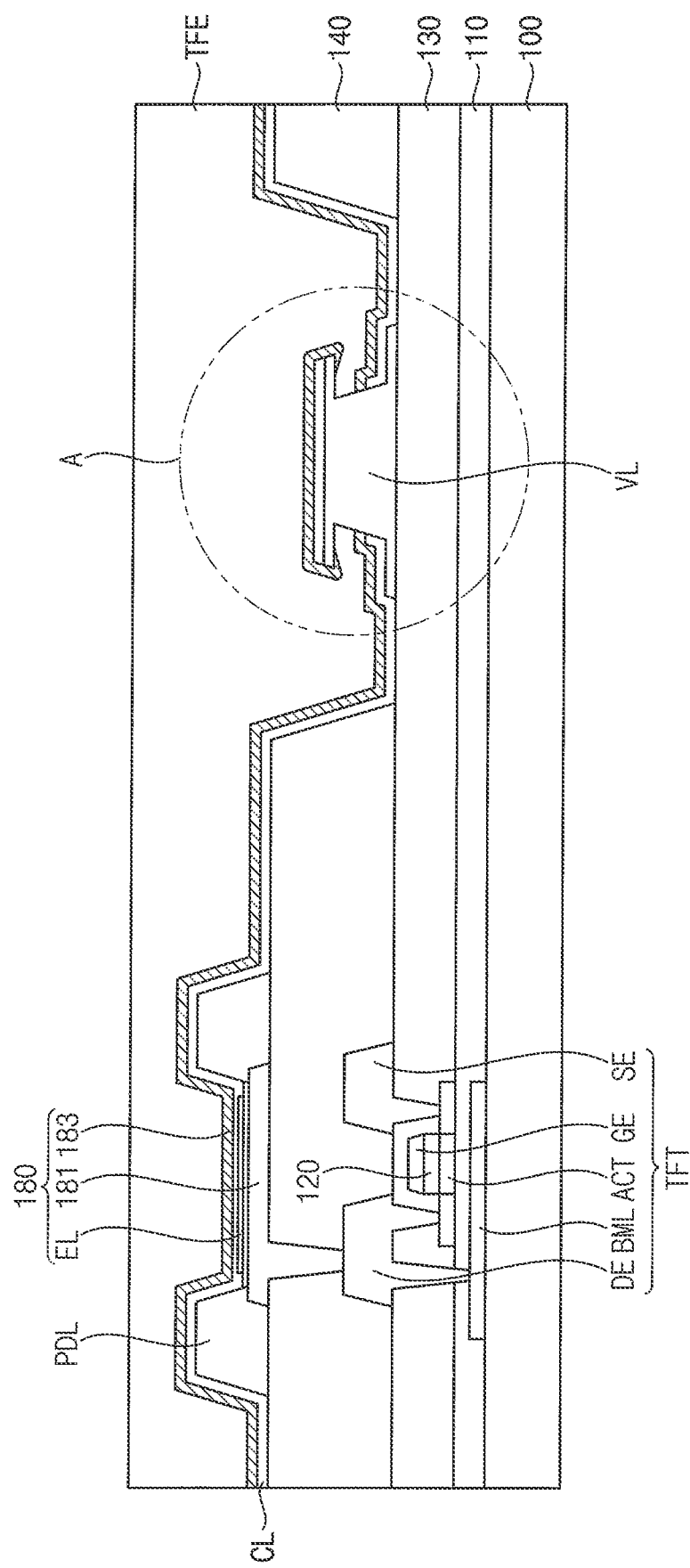
FIG. 2 is a cross-sectional view showing a display area of the display apparatus of FIG. 1.
Figure 3:
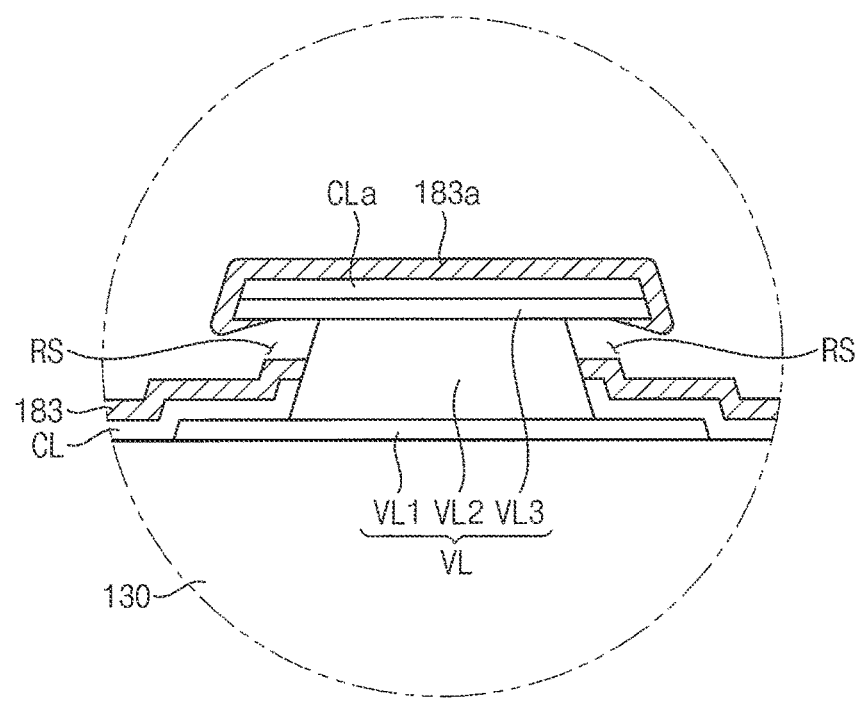
FIG. 3 is an enlarged view of the portion 'A' shown in the display apparatus of FIG. 2.
Figure 4:
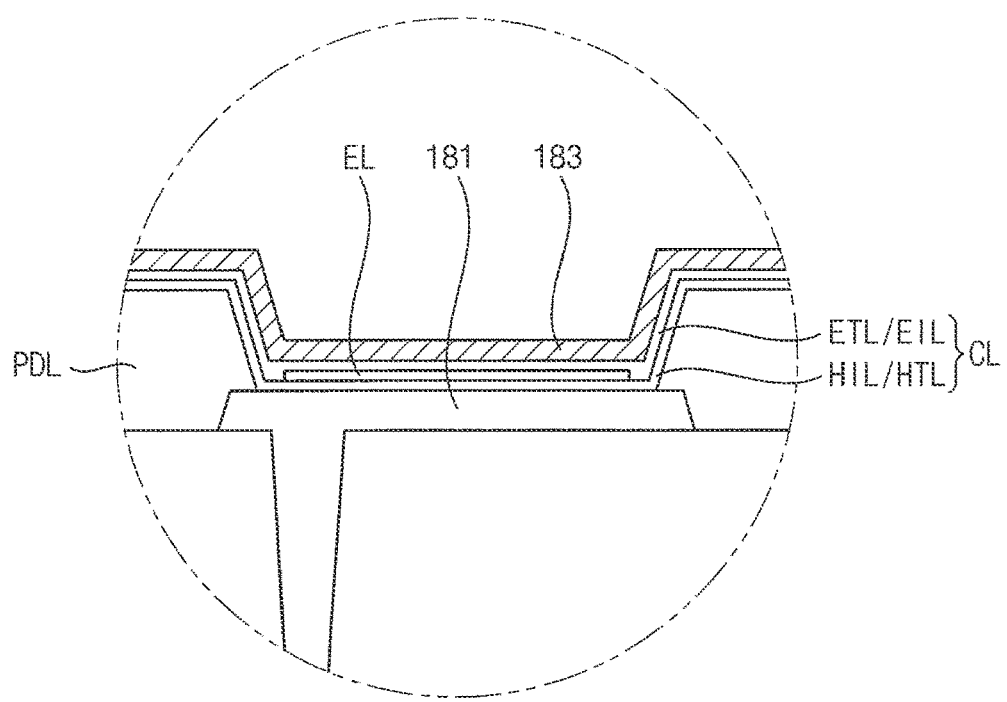
FIG. 4 is an enlarged view showing a stacked structure of a light emitting structure of the display apparatus of FIG. 2.

FIG. 2 is a cross-sectional view showing a display area of the display apparatus of FIG. 1, FIG. 3 is an enlarged view of the portion 'A' shown in the display apparatus of FIG. 2, and FIG. 4 is an enlarged view showing a stacked structure of a light emitting structure of the display apparatus of FIG. 2.

Referring to FIGS. 1 to 4, the display apparatus may include a base substrate 100, a lower blocking electrode BML, a first insulating layer 110, an active pattern ACT, a gate insulating layer 120, a gate electrode GE, an interlayer insulating layer 130, a source electrode SE, a drain electrode DE, a power supply wire VL, a via insulating layer 140, a pixel defining layer PDL, a light emitting structure 180, a common layer CL, and a thin film encapsulation layer TFE. The light emitting structure 180 may include a first electrode 181, a light emitting layer EL, and a second electrode 183.

The base substrate 100 may be formed of a transparent or opaque material. For example, the base substrate 100 may include a quartz substrate, a synthetic quartz substrate, a calcium fluoride substrate, a fluorine-doped quartz substrate (e.g., an F-doped quartz substrate), a soda lime glass substrate, a non-alkali glass substrates, and/or the like. In some embodiments, the base substrate 100 may be a transparent resin substrate having flexibility. An example of the transparent resin substrate that may be used as the base substrate 100 may include a polyimide substrate.

The lower blocking electrode BML may be disposed on the base substrate 100. The lower blocking electrode BML may overlap with the active pattern ACT to serve as a protective layer for preventing or substantially preventing electrical characteristics of the active pattern ACT configuring a thin film transistor TFT from deteriorating. In more detail, the lower blocking electrode BML may minimize or reduce a fluctuation of a threshold voltage of the thin film transistor TFT, which may be caused by an inflow of a laser beam irradiated from a lower portion of the base substrate 100 onto (e.g., into) the active pattern ACT of the thin film transistor TFT. The lower blocking electrode BML may be formed of a metal having a low light transmittance.

The first insulating layer 110 may be disposed on the base substrate 100 on which the lower blocking electrode BML is disposed. For example, the first insulating layer 110 may be disposed on the base substrate 100 to cover the lower blocking electrode BML. The first insulating layer 110 may prevent or substantially prevent metal atoms and/or impurities from diffusing from the base substrate 100 into the active pattern ACT, and may control a heat transfer rate during a crystallization process for forming the active pattern ACT to obtain a uniform or substantially uniform active pattern ACT.

The active pattern ACT of the thin film transistor TFT may be disposed on the buffer layer 110. The active pattern ACT may include amorphous silicon or polycrystalline silicon. In another embodiment, the active pattern ACT may include an oxide of at least one material selected from the group consisting of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The active pattern ACT may include a drain region and a source region, which are doped with impurities, and a channel region disposed between the drain region and the source region.

The gate insulating layer 120 may be disposed on the channel region of the active pattern ACT. The gate insulating layer 120 may include an inorganic insulating material, for example, such as a silicon compound and a metal oxide. The gate insulating layer 120 may include a plurality of layers.

The gate electrode GE of the thin film transistor TFT may be disposed on the gate insulating layer 120. The gate electrode GE may be formed by using a metal, an alloy, a metal nitride, a conductive metal oxide, a transparent conductive material, and/or the like.

The interlayer insulating layer 130 may be disposed on the active pattern ACT on which the gate electrode GE is disposed, and on the first insulating layer 110. For example, the interlayer insulating layer 130 may cover (e.g., may sufficiently cover) the active pattern ACT and the gate electrode GE on the first insulating layer 110, and may have a flat or substantially flat top surface without creating a gap around the active pattern ACT and the gate electrode GE. In another embodiment, the interlayer insulating layer 130 may be disposed along a profile of the active pattern ACT and the gate electrode GE with a uniform or substantially uniform thickness to cover the active pattern ACT and the gate electrode GE on the first insulating layer 110. The interlayer insulating layer 130 may include a plurality of layers.

The source electrode SE and the drain electrode DE of the thin film transistor TFT, and the power supply wire VL may be disposed on the interlayer insulating layer 130. The source electrode SE may be electrically connected to the source region of the active pattern ACT through a contact hole formed through the interlayer insulating layer 130. The drain electrode DE may be electrically connected to the drain region of the active pattern ACT through a contact hole formed through the interlayer insulating layer 130. The drain electrode DE may be electrically connected to the lower blocking electrode BML through a contact hole formed through the interlayer insulating layer 130 and the first insulating layer 110.

The source electrode SE, the drain electrode DE, and the power supply wire VL may be formed at (e.g., in or on) the same layer. The power supply wire VL may include a first conductive layer VL1, a second conductive layer VL2 disposed on the first conductive layer VL1, and a third conductive layer VL3 disposed on the second conductive layer VL2.

In this case, the third conductive layer VL3 may protrude more than a side surface of the second conductive layer VL2 to form an undercut (e.g., see FIG. 3). In other words, when measured from a section of the power supply wire VL in a width direction of the power supply wire VL, a width of the second conductive layer VL2 may be less than (e.g., smaller than) a width of the third conductive layer VL3 and a width of the first conductive layer VL1. Accordingly, the third conductive layer VL3 may protrude more than the second conductive layer VL2 on a side surface of the power supply wire VL, so that a recessed part RS may be formed on the side surface of the power supply wire VL. The undercut may be formed through a process of collectively etching and patterning the third conductive layer VL3, the second conductive layer VL2, and the first conductive layer VL1, or through a process of separately etching only the side surface of the second conductive layer VL2, and may be formed by taking into consideration that the second conductive layer VL2 may include a different material from those of the first and third conductive layers VL1 and VL3.

For example, in an embodiment, the first conductive layer VL1 may include titanium, the second conductive layer VL2 may include aluminum, and the third conductive layer VL3 may include titanium. According to another embodiment, for example, the first conductive layer VL1 may include titanium, the second conductive layer VL2 may include copper, and the third conductive layer VL3 may include titanium. However, the present disclosure is not limited thereto.

The via insulating layer 140 may be disposed on the interlayer insulating layer 130 on which the source electrode SE, the drain electrode DE, and the power supply wire VL are disposed. The via insulating layer 140 may have an opening that exposes the power supply wire VL to allow the power supply wire VL to be electrically connected to the second electrode 183.

The first electrode 181 may be disposed on the via insulating layer 140. The first electrode 181 may be electrically connected to the thin film transistor TFT through a contact hole formed through the via insulating layer 140. For example, in some embodiments, the first electrode 181 may be electrically connected to the drain electrode DE of the thin film transistor TFT through the contact hole, but the present disclosure is not limited thereto.

Depending on a light emitting scheme of the display apparatus, the first electrode 181 may be formed by using a reflective material or a transmissive material. For example, the first electrode 181 may include aluminum, an aluminum-containing alloy, aluminum nitride, silver, a silver-containing alloy, tungsten, tungsten nitride, copper, a copper-containing alloy, nickel, chromium, chromium nitride, molybdenum, a molybdenum-containing alloy, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, and/or the like. These materials may be used alone or in combination with each other. In some example embodiments, the first electrode 181 may have a single-layer structure or a multilayered structure including a metal film, an alloy film, a metal nitride film, a conductive metal oxide film, and/or a transparent conductive material film.

The pixel defining layer PDL may be disposed on the via insulating layer 140 on which the first electrode 181 is disposed. The pixel defining layer PDL may be formed by using an organic material, an inorganic material, and/or the like. For example, the pixel defining layer PDL may be formed by using a photoresist, a polyacryl-based resin, a polyimide-based resin, an acryl-based resin, a silicone compound, and/or the like. According to some example embodiments, the pixel defining layer PDL may be etched to form an opening that partially exposes the first electrode 181. An emission area and a non-emission area of the display apparatus may be defined by the opening of the pixel defining layer PDL. For example, a portion where the opening of the pixel defining layer PDL is located may correspond to the emission area, and the non-emission area may correspond to a portion adjacent to the opening of the pixel defining layer PDL.

The common layer CL and the light emitting layer EL may be disposed on the first electrode 181 exposed through the opening of the pixel defining layer PDL.

In some example embodiments, the common layer CL may have a multilayered structure including a hole injection layer HIL, a hole transport layer HTL, an electron transport layer ETL, an electron injection layer EIL, and/or the like. Other than the light emitting layer EL, the hole injection layer HIL, the hole transport layer HTL, the electron transport layer ETL, and the electron injection layer EIL may be commonly formed to correspond to a plurality of pixels. The common layer CL may contact (e.g., directly contact) the side surface of the second conductive layer VL2 of the power supply wire VL. A first cover part CLa including the same material as that of the common layer CL may be disposed on the third conductive layer VL3.

An organic emission layer of the light emitting layer EL may be formed by using suitable light emitting materials for generating different colored lights, for example, such as red light, green light, and blue light, according to each of the pixels of the display apparatus. According to other example embodiments, the organic emission layer of the light emitting layer EL may have a structure in which a plurality of light emitting materials for implementing different colored lights, for example, such as red light, green light, and blue light, may be stacked on one another to emit white light. In this case, the above light emitting structures may be commonly formed to correspond to the pixels, and the pixels may be classified by a color filter layer.

The second electrode 183 may be disposed on the pixel defining layer PDL, the light emitting layer EL, and the common layer CL. Depending on the light emitting scheme of the display apparatus, the second electrode 183 may include a transmissive material or a reflective material. For example, the second electrode 183 may include aluminum, an aluminum-containing alloy, aluminum nitride, silver, a silver-containing alloy, tungsten, tungsten nitride, copper, a copper-containing alloy, nickel, chromium, chromium nitride, molybdenum, a molybdenum-containing alloy, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, and/or the like. These materials may be used alone or in combination with each other. In some example embodiments, the second electrode 183 may have a single-layer structure or a multilayered structure including a metal film, an alloy film, a metal nitride film, a conductive metal oxide film, and/or a transparent conductive material film.

The second electrode 183 may contact (e.g., directly contact) the side surface of the second conductive layer VL2 of the power supply wire VL. A second cover part 183a including the same material as that of the second electrode 183 may be disposed on the first cover part CLa that is disposed on the third conductive layer VL3. The second cover part 183a disposed over the third conductive layer VL3 may be spaced apart from the second electrode 183 connected to the side surface of the second conductive layer VL2.

The thin film encapsulation layer TFE may be disposed on the second electrode 183. The thin film encapsulation layer TFE may prevent or substantially prevent moisture and/or oxygen from penetrating from an outside. The thin film encapsulation layer TFE may include at least one organic layer and at least one inorganic layer. The at least one organic layer and the at least one inorganic layer may be alternately stacked on one another. For example, the thin film encapsulation layer TFE may include a first inorganic layer, a second inorganic layer, and an organic layer disposed between the first inorganic layer and the second inorganic layer, but the present disclosure is not limited thereto. In another embodiment, instead of the thin film encapsulation layer, a sealing substrate may be provided to block or substantially block outside air and/or moisture from penetrating into the display apparatus.

Generally, a process of forming a contact hole by using laser drilling or forming a contact hole by using a separate mask is performed for a contact between conductive layers.

According to the present embodiment, the power supply wire VL may be connected to the second electrode 183 without the separate laser drilling process or the separate photo-process using the mask, so that the display apparatus capable of preventing or reducing the IR drop while reducing manufacturing costs, and having a simplified structure may be provided.

In more detail, while forming the common layer CL and forming the second electrode 183, when a condition of an incident angle at which a deposition material is provided from an end of the third conductive layer VL3 toward the side surface of the second conductive layer VL2 is appropriately adjusted, the second electrode 183 may be formed at a position higher than a position of the common layer CL on the side surface of the second conductive layer VL2, so that the second electrode 183 and the power supply wire VL may be electrically connected to each other.

Figure 5:
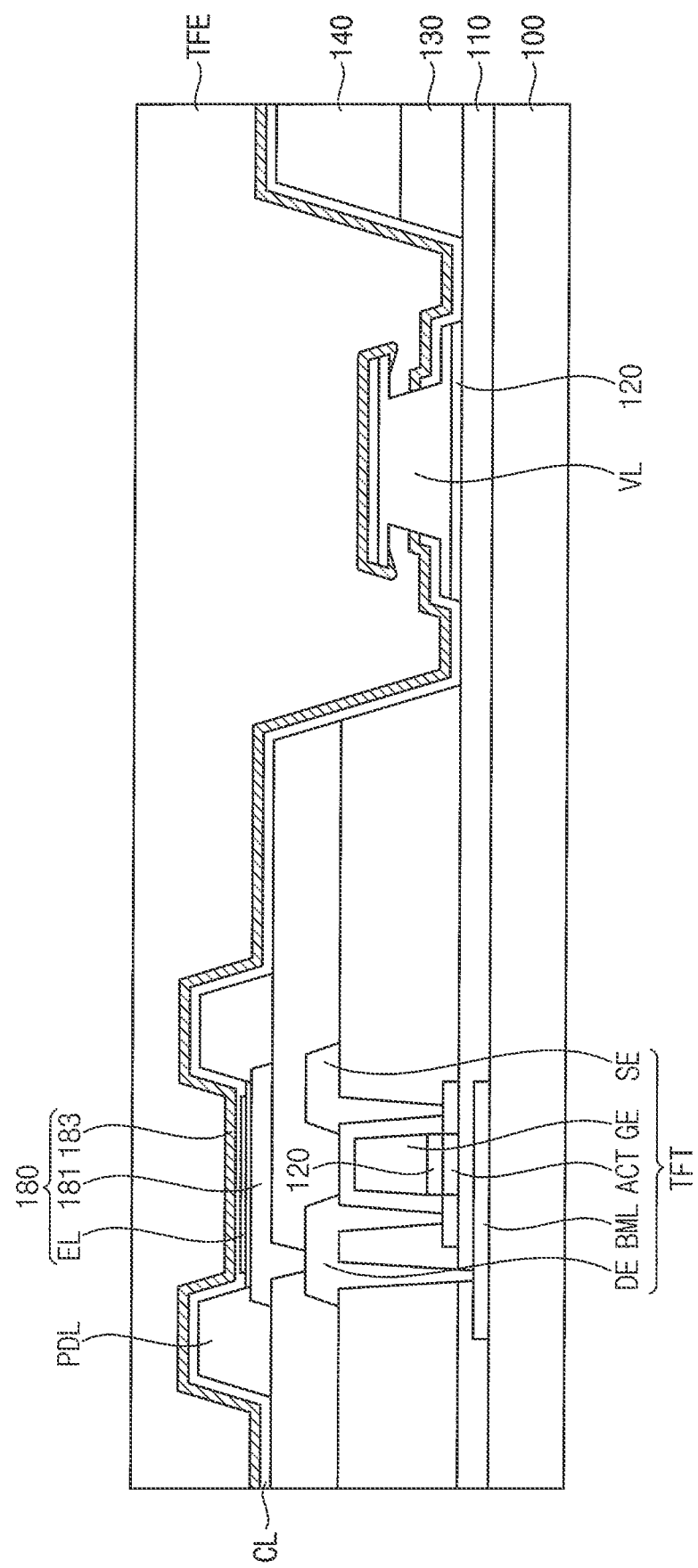
FIG. 5 is a cross-sectional view showing a display area of a display apparatus according to one or more example embodiments.

FIG. 5 is a cross-sectional view showing a display area of a display apparatus according to one or more example embodiments.

The display apparatus shown in FIG. 5 is the same or substantially the same as the display apparatus shown in FIGS. 1 to 4, except that the power supply wire VL is formed at (e.g., in or on) the same layer as that of the gate electrode GE. Therefore, redundant descriptions thereof may not be repeated.

Referring to FIG. 5, the display apparatus may include a base substrate 100, a lower blocking electrode BML, a first insulating layer 110, an active pattern ACT, a gate insulating layer 120, a gate electrode GE, an interlayer insulating layer 130, a source electrode SE, a drain electrode DE, a power supply wire VL, a via insulating layer 140, a pixel defining layer PDL, a light emitting structure 180, a common layer CL, and a thin film encapsulation layer TFE. The light emitting structure 180 may include a first electrode 181, a light emitting layer EL, and a second electrode 183.

The interlayer insulating layer 130 and the via insulating layer 140 may have openings that expose the power supply wire VL to allow the power supply wire VL to be electrically connected to the second electrode 183.

The power supply wire VL may include a first conductive layer VL1, a second conductive layer VL2, and a third conductive layer VL3 (e.g., see FIG. 3). The second electrode 183 may contact (e.g., directly contact) the side surface of the second conductive layer VL2 of the power supply wire VL.

Figure 6:
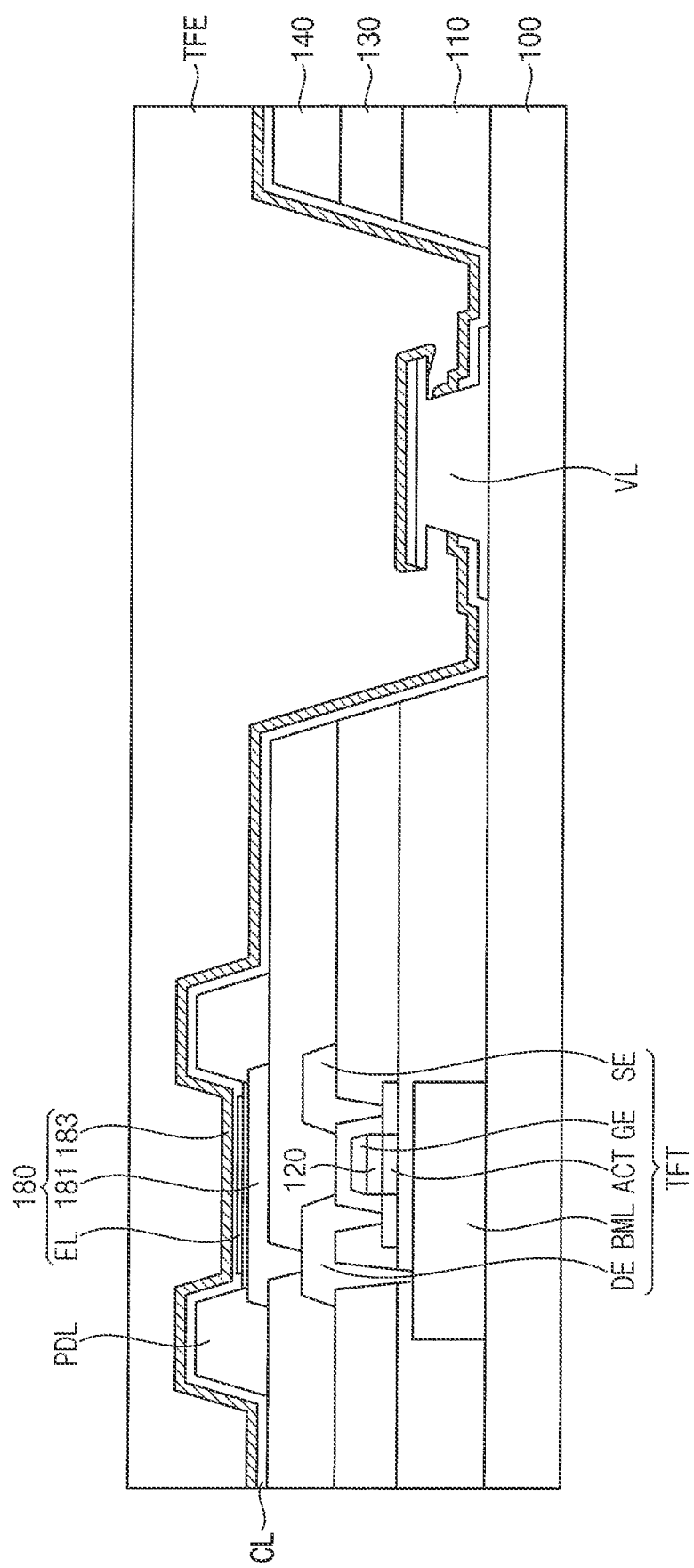
FIG. 6 is a cross-sectional view showing a display area of a display apparatus according to one or more example embodiments.

FIG. 6 is a cross-sectional view showing a display area of a display apparatus according to one or more example embodiments.

The display apparatus shown in FIG. 6 is the same or substantially the same as the display apparatus shown in FIGS. 1 to 4, except that the power supply wire VL is formed at (e.g., in or on) the same layer as that of the lower blocking electrode BML. Therefore, redundant descriptions thereof may not be repeated.

Referring to FIG. 6, the display apparatus may include a base substrate 100, a lower blocking electrode BML, a first insulating layer 110, an active pattern ACT, a gate insulating layer 120, a gate electrode GE, an interlayer insulating layer 130, a source electrode SE, a drain electrode DE, a power supply wire VL, a via insulating layer 140, a pixel defining layer PDL, a light emitting structure 180, a common layer CL, and a thin film encapsulation layer TFE. The light emitting structure 180 may include a first electrode 181, a light emitting layer EL, and a second electrode 183.

The first insulating layer 110, the interlayer insulating layer 130, and the via insulating layer 140 may have openings that expose the power supply wire VL to allow the power supply wire VL to be electrically connected to the second electrode 183.

The power supply wire VL may include a first conductive layer VL1, a second conductive layer VL2, and a third conductive layer VL3 (e.g., see FIG. 3). The second electrode 183 may contact (e.g., directly contact) the side surface of the second conductive layer VL2 of the power supply wire VL.

Figure 7:
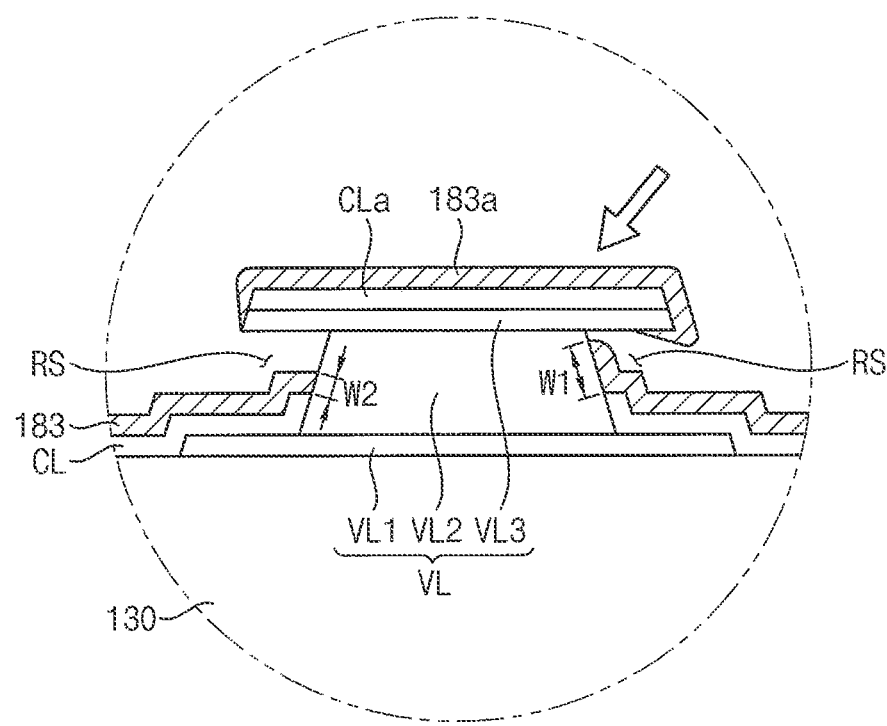
FIG. 7 is an enlarged view showing a power supply wire of a display apparatus according to one or more example embodiments.

FIG. 7 is an enlarged view showing a power supply wire of a display apparatus according to one or more example embodiments.

The display apparatus shown in FIG. 7 is the same or substantially the same as the display apparatus shown in FIGS. 1 to 4, except for a shape of the second electrode 183 contacting (e.g., directly contacting) a first side surface and a second side surface of the second conductive layer VL2 of the power supply wire VL may be different. Therefore, redundant descriptions thereof may not be repeated.

Referring to FIG. 7, the display apparatus may include a base substrate 100, a lower blocking electrode BML, a first insulating layer 110, an active pattern ACT, a gate insulating layer 120, a gate electrode GE, an interlayer insulating layer 130, a source electrode SE, a drain electrode DE, a power supply wire VL, a via insulating layer 140, a pixel defining layer PDL, a light emitting structure 180, a common layer CL, a first cover part CLa, a second cover part 183a, and a thin film encapsulation layer TFE (e.g., see FIGS. 2 and 4-7). The light emitting structure 180 may include a first electrode 181, a light emitting layer EL, and a second electrode 183 (e.g., see FIGS. 2 and 4-6).

The power supply wire VL may include a first conductive layer VL1, a second conductive layer VL2, and a third conductive layer VL3. The second conductive layer VL2 of the power supply wire VL may include a first side surface (e.g., a right side of the second conductive layer VL2 in FIG. 7), and a second side surface (e.g., a left side of the second conductive layer VL2 in FIG. 7) opposite to the first side surface. A recessed part RS formed by an undercut may be formed at (e.g., in or on) the first side surface and the second side surface of the second conductive layer VL2.

When measured in a length direction crossing the width direction of the power supply wire VL in a cross section extending through the first side surface and the second side surface, a contact length w1 between the second conductive layer VL2 and the second electrode 183 on the first side surface of the second conductive layer VL2 may be greater than a contact length w2 between the second conductive layer VL2 and the second electrode 183 on the second side surface of the second conductive layer VL2. In other words, the contact length w1 of a portion of the second electrode 183 contacting the first side surface of the second conductive layer VL2 may be greater than the contact length w2 of a portion of the second electrode 183 contacting the second side surface of the second conductive layer VL2.

This may be achieved by supplying a deposition material in a direction inclined at a suitable angle (e.g., a predetermined angle) with respect to a direction perpendicular to or substantially perpendicular to the base substrate 100 when the second electrode 183 is formed (e.g., see the arrow in FIG. 7).

Accordingly, a contact area for electrically connecting the second electrode 183 to the power supply wire VL may be ensured on the first side surface of the second conductive layer VL2.

Figure 8:
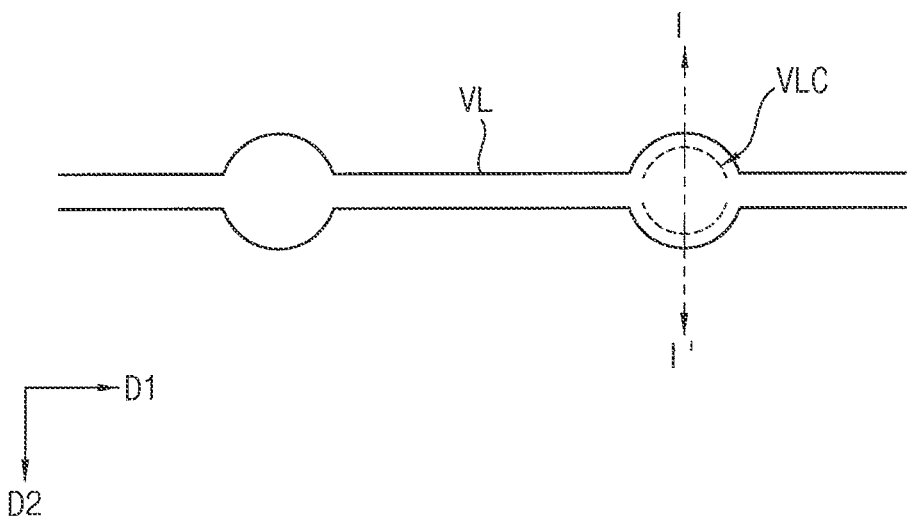
FIG. 8 is a plan view showing a power supply wire in a display area of a display apparatus according to one or more example embodiments.
Figure 9:
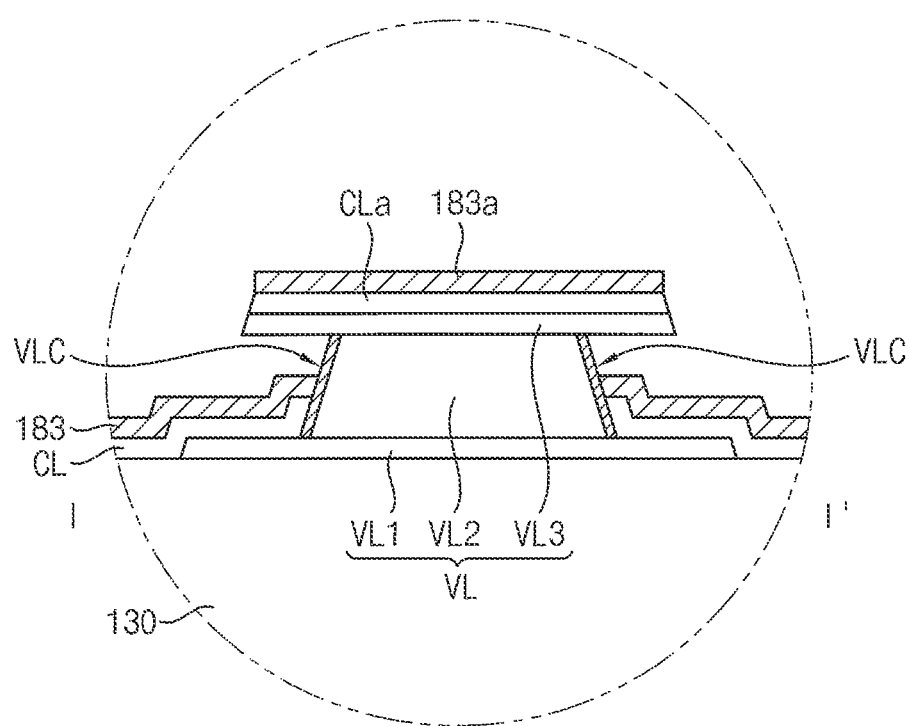
FIG. 9 is a cross-sectional view taken along the line I-I' in FIG. 8.

FIG. 8 is a plan view showing a power supply wire in a display area of a display apparatus according to one or more example embodiments, and FIG. 9 is a cross-sectional view taken along the line I-I' in FIG. 8.

The display apparatus shown in FIGS. 8 and 9 is the same or substantially the same as the display apparatus shown in FIGS. 1 to 4, except that the power supply wire VL further includes a contact part VLC. Therefore, redundant descriptions thereof may not be repeated.

The display apparatus may include a base substrate 100, a lower blocking electrode BML, a first insulating layer 110, an active pattern ACT, a gate insulating layer 120, a gate electrode GE, an interlayer insulating layer 130, a source electrode SE, a drain electrode DE, a power supply wire VL, a via insulating layer 140, a pixel defining layer PDL, a light emitting structure 180, a common layer CL, a first cover part CLa, a second cover part 183a, and a thin film encapsulation layer TFE (e.g., see FIGS. 2-7). The light emitting structure 180 may include a first electrode 181, a light emitting layer EL, and a second electrode 183 (e.g., see FIGS. 2 and 4-6).

The power supply wire VL may include a first conductive layer VL1, a second conductive layer VL2, and a third conductive layer VL3 (e.g., see FIGS. 2-3 and 5-7).

The power supply wire VL may extend in a first direction D1. The power supply wire VL may include a contact part VLC protruding in a second direction D2 crossing (e.g., perpendicular to or substantially perpendicular to) the first direction D1. In other words, the contact part VLC may have a semi-circular shape when viewed in a plane (e.g., when viewed in a plan view), and may be formed on sides (e.g., both sides or opposite sides) of the power supply wire VL in the second direction D2 to form a circular shape as a whole. However, the present disclosure is not limited thereto, and in some embodiments, the contact part VLC may be formed only on one side of the power supply wire VL (e.g., in the second direction D2) to have the semi-circular shape.

In the contact part VLC, the second electrode 183 may contact (e.g., may directly contact) a side surface of the second conductive layer VL2. The contact part VLC may have a circular shape when viewed in a plan view. Accordingly, an area where the second electrode 183 is able to make contact with the second conductive layer VL2 may be sufficiently ensured.

FIGS. 10A, 10B, 11A, 11B, 12, 13A, 13B, 14A, 14B, 15A, and 15B are cross-sectional views illustrating a method of manufacturing a display apparatus according to one or more example embodiments.

In brief overview, a method of manufacturing a display apparatus may include: sequentially forming a first conductive layer, a second conductive layer, and a third conductive layer on a base substrate; forming a power supply wire by patterning the third conductive layer, the second conductive layer, and the first conductive layer; forming a via insulating layer on the base substrate on which the power supply wire is formed; forming a first electrode on the via insulating layer; forming a common layer on the base substrate on which the first electrode is formed; and forming a second electrode on the common layer. The third conductive layer of the power supply wire may protrude more than a side surface of the second conductive layer to form an undercut. In the forming of the second electrode, the second electrode may contact (e.g., may directly contact) the side surface of the second conductive layer.

Figure 10A:
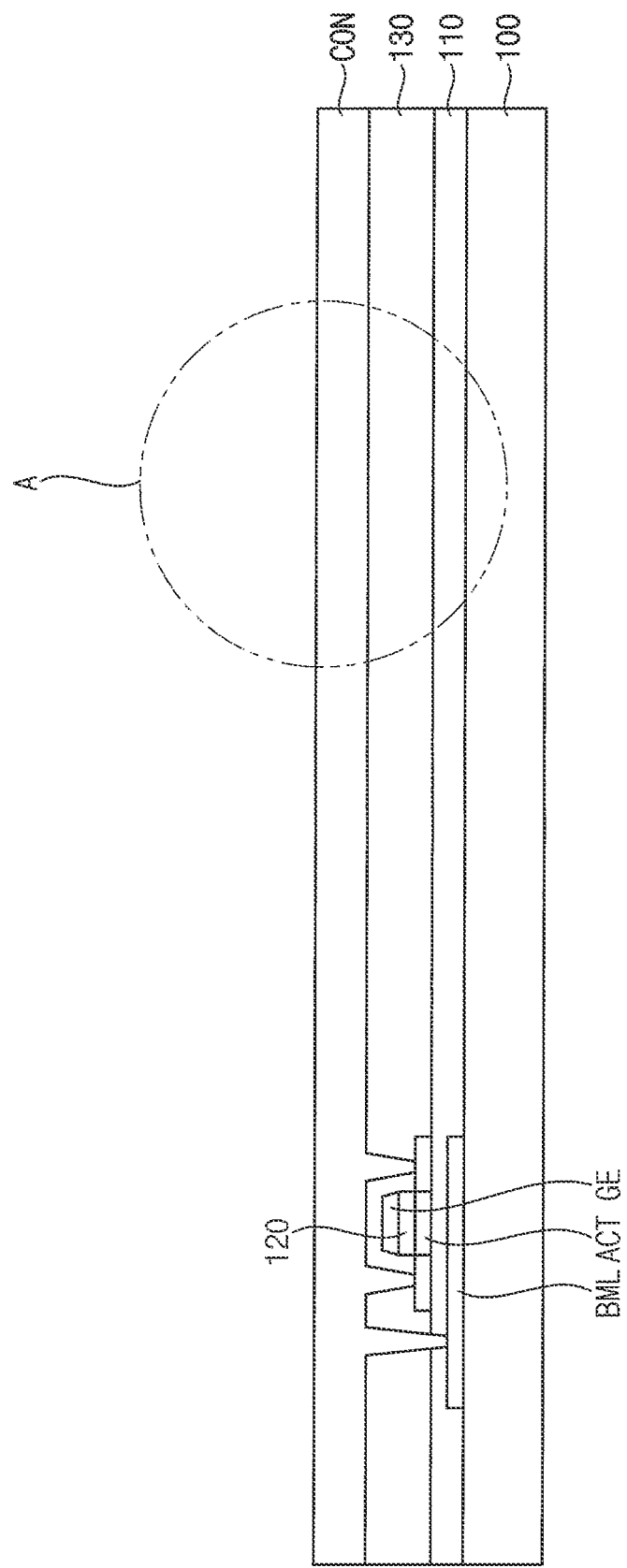
Figure 10B:
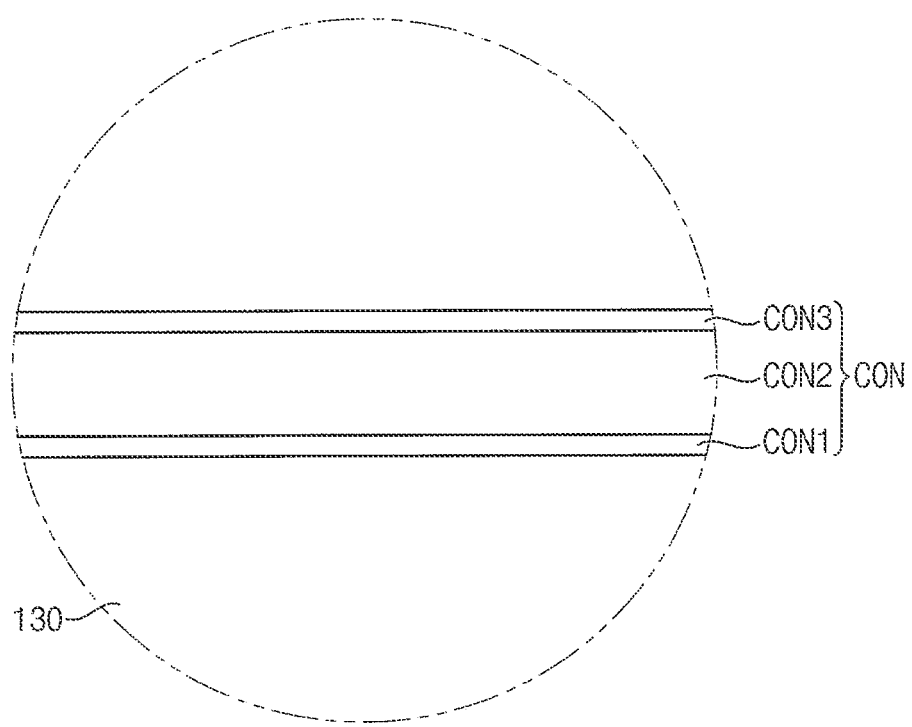

In more detail, referring to FIGS. 10A and 10B, a lower blocking electrode BML, a first insulating layer 110, an active pattern ACT, a gate insulating layer 120, a gate electrode GE, and an interlayer insulating layer 130 may be formed on the base substrate 100.

A preliminary conductive layer CON may be formed on the interlayer insulating layer 130.

The preliminary conductive layer CON may include a first preliminary conductive layer CON1, a second preliminary conductive layer CON2 disposed on the first preliminary conductive layer CON1, and a third preliminary conductive layer CON3 disposed on the second preliminary conductive layer CON2.

Figure 11B:
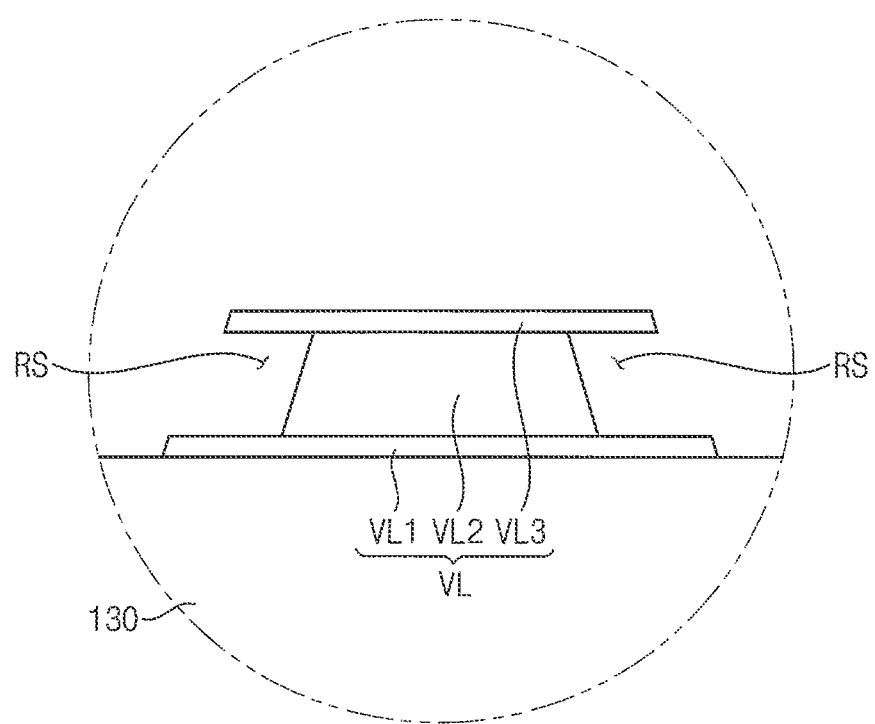

Referring to FIGS. 11A and 11B, the preliminary conductive layer CON may be patterned to form a source electrode SE, a drain electrode DE, and a power supply wire VL. The power supply wire VL may include a first conductive layer VL1 formed from the first preliminary conductive layer CON1, a second conductive layer VL2 formed from the second preliminary conductive layer CON2, and a third conductive layer VL3 formed from the third preliminary conductive layer CON3.

In this case, for example, when the first conductive layer VL1 includes titanium, the second conductive layer VL2 includes aluminum, and the third conductive layer VL3 includes titanium, during the forming of the power supply wire VL, the first to third conductive layers VL1, VL2, and VL3 may be patterned through dry etching to form the undercut. Accordingly, a recessed part RS may be formed on a side surface of the power supply wire VL. For example, the recessed part RS may be formed at (e.g., in or on) a side surface of the second conductive layer VL2, such that a width of the second conductive layer VL2 is less than widths of the first and third conductive layers VL1 and VL3.

However, the present disclosure is not limited thereto, and according to another embodiment, for example, when the first conductive layer VL1 includes titanium, the second conductive layer VL2 includes copper, and the third conductive layer VL3 includes titanium, during the forming of the power supply wire VL, the first to third conductive layers may be patterned through wet etching, and the undercut may be formed by selective etching of the second conductive layer VL2 to form the recessed part RS.

According to still another embodiment, for example, when the first conductive layer VL1 includes titanium, the second conductive layer VL2 includes aluminum, and the third conductive layer VL3 includes titanium, during the forming of the first electrode 181, which will be described in more detail below, the first electrode may be patterned through wet etching, and the undercut may be formed by selective etching of the second conductive layer VL2.

Figure 12:
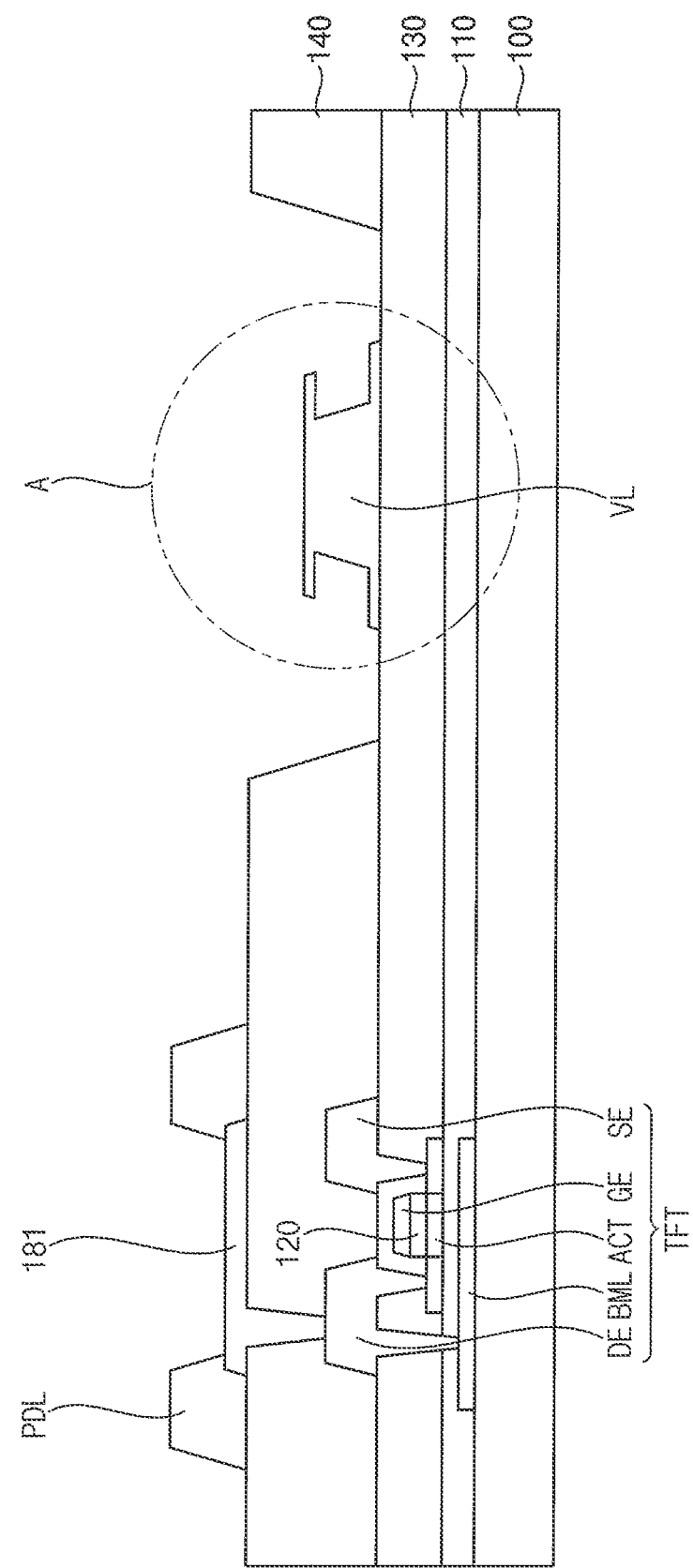

Referring to FIG. 12, a via insulating layer 140 having an opening that exposes the power supply wire VL may be formed on the interlayer insulating layer 130 on which the source electrode SE, the drain electrode DE, and the power supply wire VL are formed. The first electrode 181 may be formed on the via insulating layer 140. A pixel defining layer PDL may be formed on the via insulating layer 140 on which the first electrode 181 is formed.

Figure 13A:
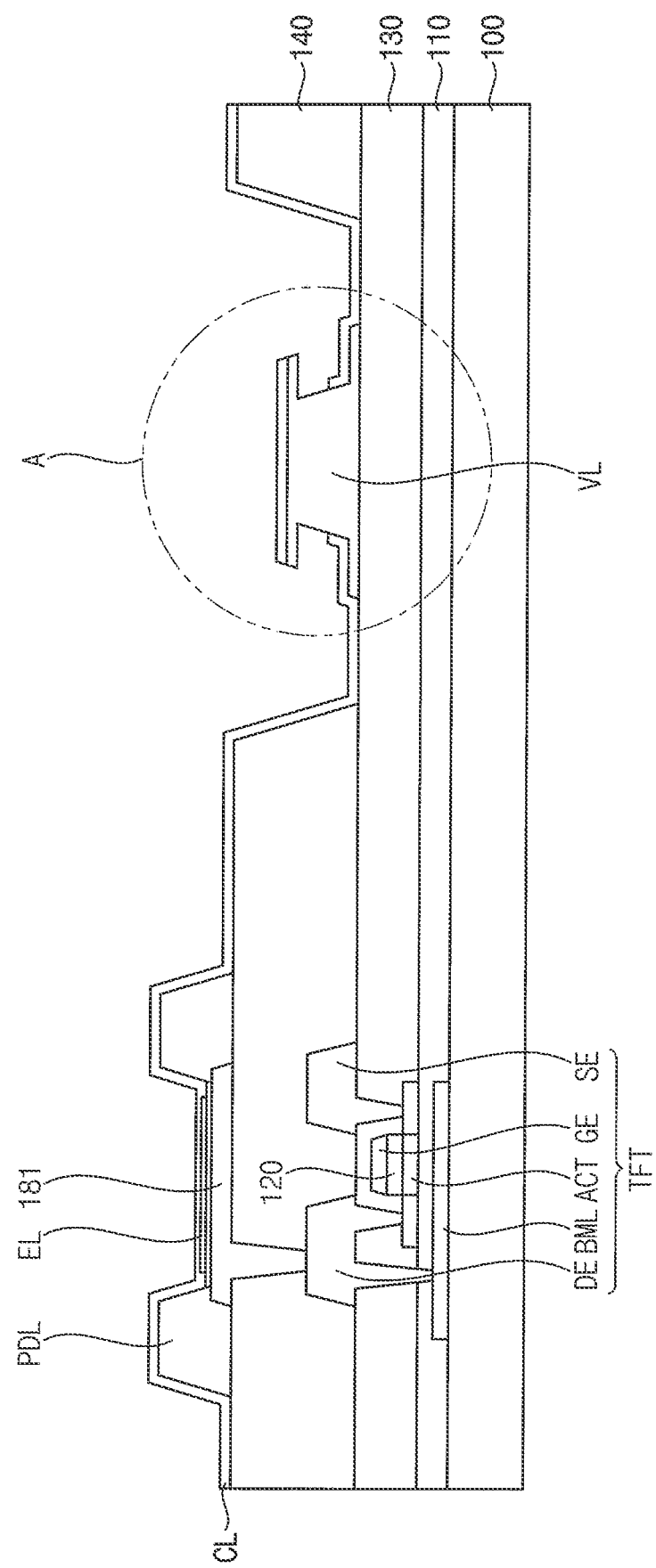
Figure 13B:
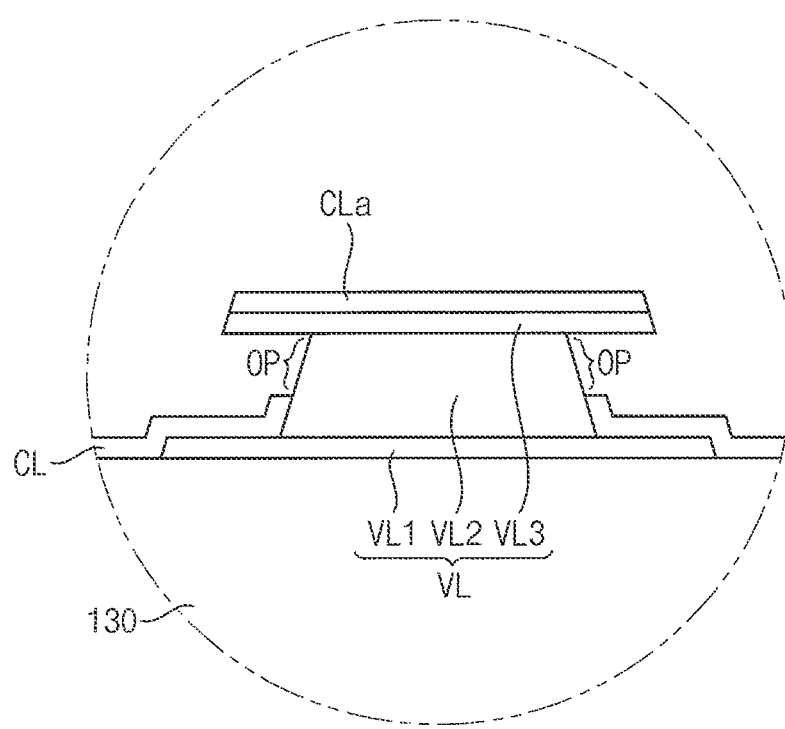

Referring to FIGS. 13A and 13B, a common layer CL and a light emitting layer EL may be formed on the base substrate 100 on which the pixel defining layer PDL is formed.

The common layer CL may be formed over an entirety of (e.g., over the whole) base substrate 100. The common layer CL may have a multilayered structure including a hole injection layer, a hole transport layer, an electron transport layer, an electron injection layer, and/or the like.

Because the common layer CL is formed over the entirety of (e.g., over the whole) base substrate 100, the common layer CL may be formed on a top surface of the third conductive layer VL3 of the power supply wire VL (e.g., see the first cover part CLa). Because the undercut is formed between the third conductive layer VL3 and the second conductive layer VL2 of the power supply wire VL, a portion of the side surface of the second conductive layer VL2 may be exposed without being covered by the first cover part CLa and the common layer CL (e.g., see OP).

Before forming the electron transport layer of the common layer CL, the light emitting layer EL may be formed on the hole transport layer to overlap with the first electrode 181.

Figure 14A:
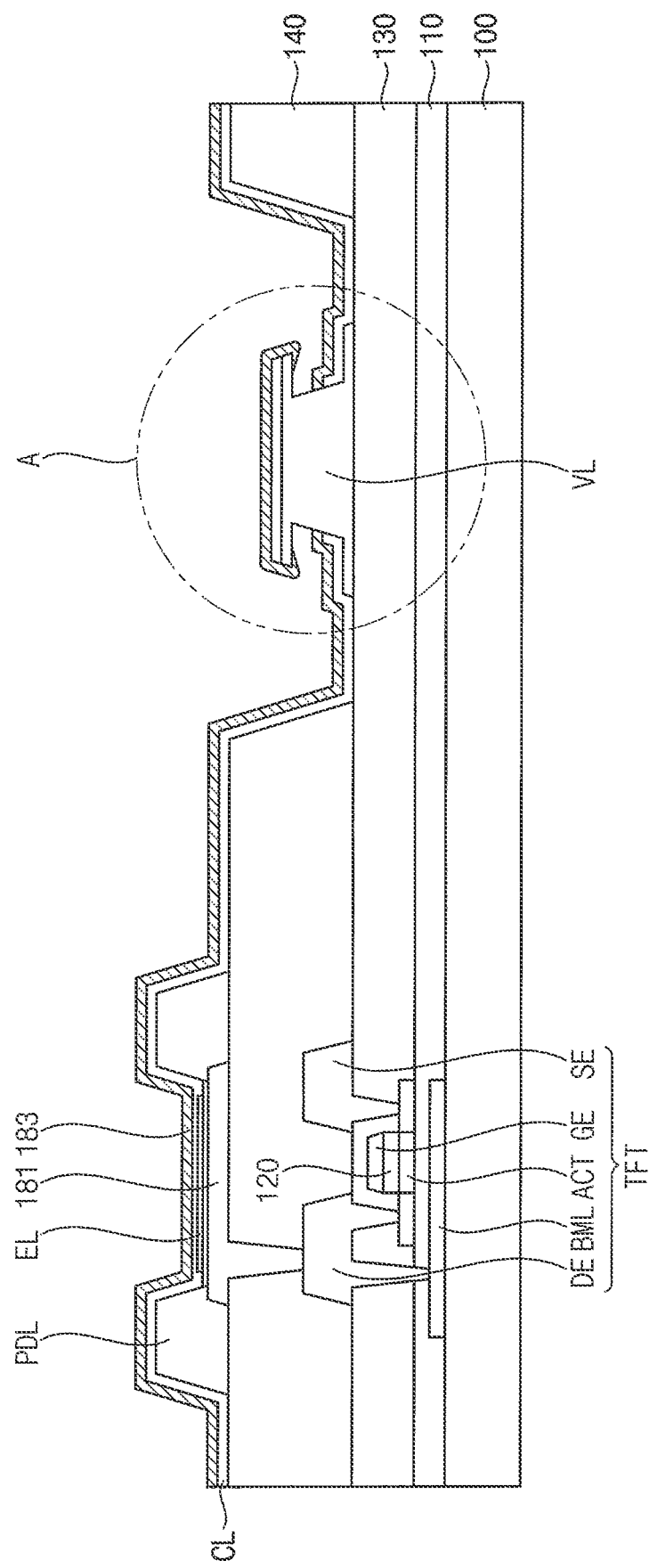
Figure 14B:
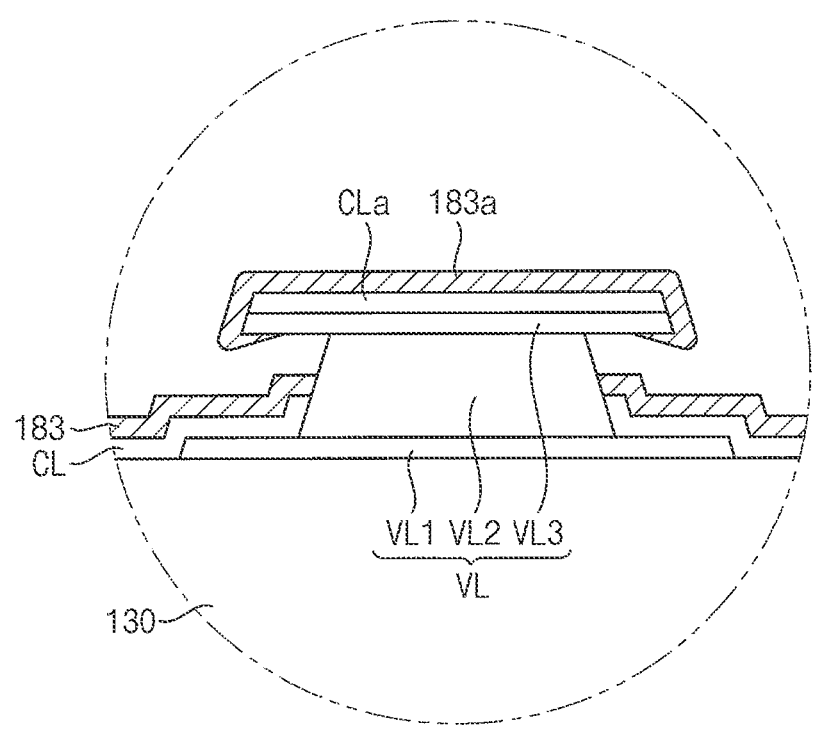

Referring to FIGS. 14A and 14B, a second electrode 183 may be formed on the common layer CL. The second electrode 183 may be formed over an entirety of (e.g., over the whole) base substrate 100. In other words, in some embodiments, the second electrode 183 may be formed by using an open mask.

In this case, the second electrode 183 may contact (e.g., may directly contact) the side surface of the second conductive layer VL2 of the power supply wire VL. When the second electrode 183 is formed, the second electrode 183 may be formed through a process with a suitable step coverage (e.g., with an excellent step coverage), so that a deposition material may be deposited on the undercut between the third conductive layer VL3 and the second conductive layer VL2 of the power supply wire VL. Accordingly, a second cover part 183a may be formed on the first cover part CLa.

For example, the second electrode 183 may be formed by using an (thermal) atomic layer deposition (ALD) process and/or the like, and/or a general deposition process.

Figure 15A:
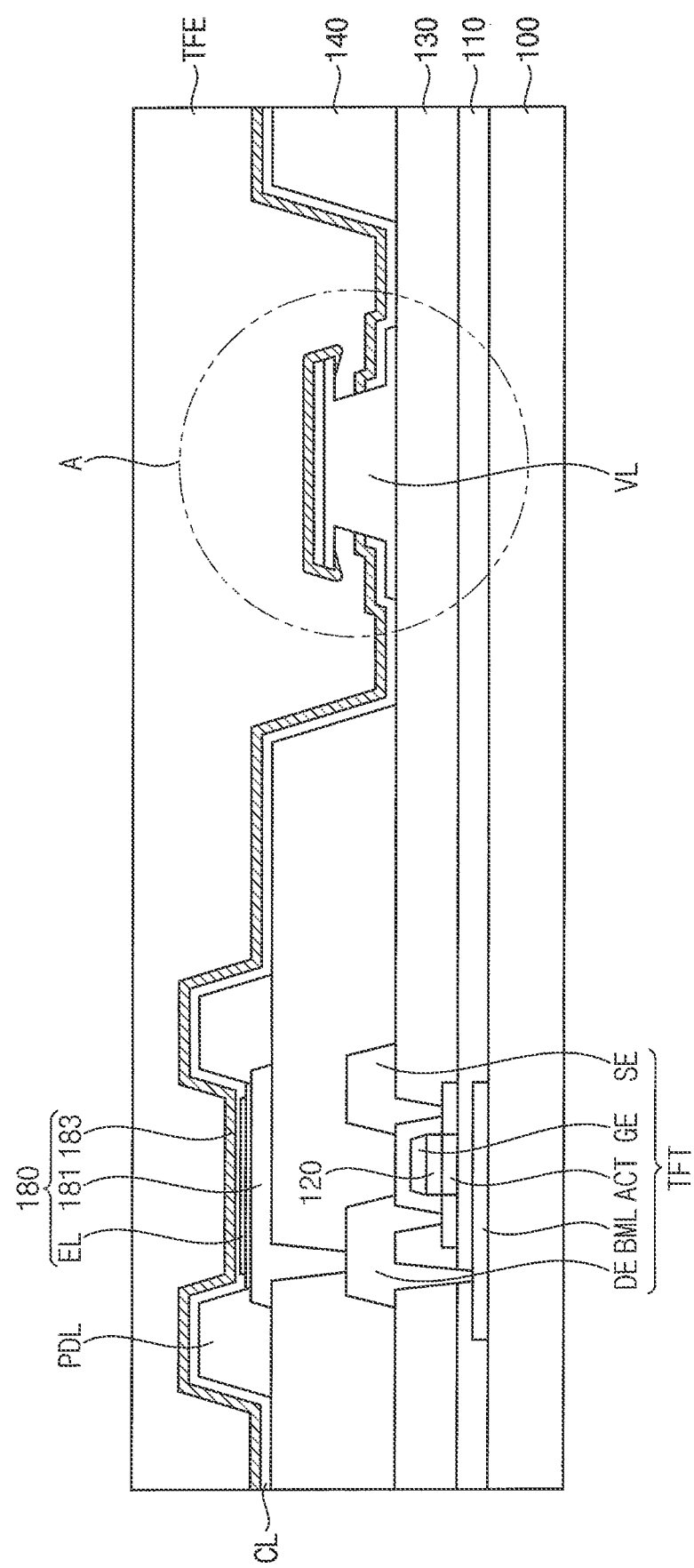
Figure 15B:
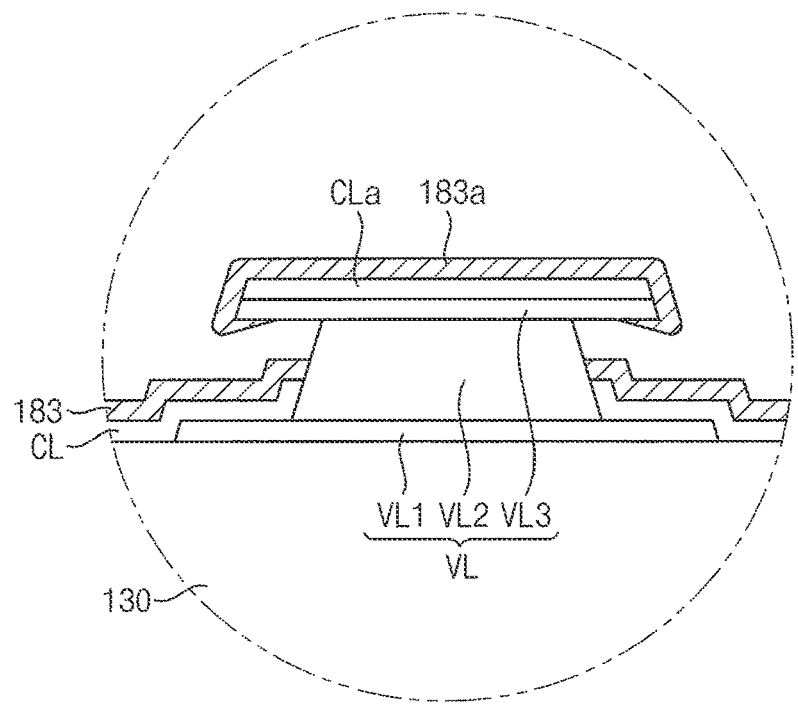

Referring to FIGS. 15A and 15B, a thin film encapsulation layer TFE may be formed on the second electrode 183, so that the display apparatus may be manufactured. In some embodiments, each component of the display apparatus may be formed through various suitable processes as would be known to those having ordinary skill in the arts.

Figure 16:
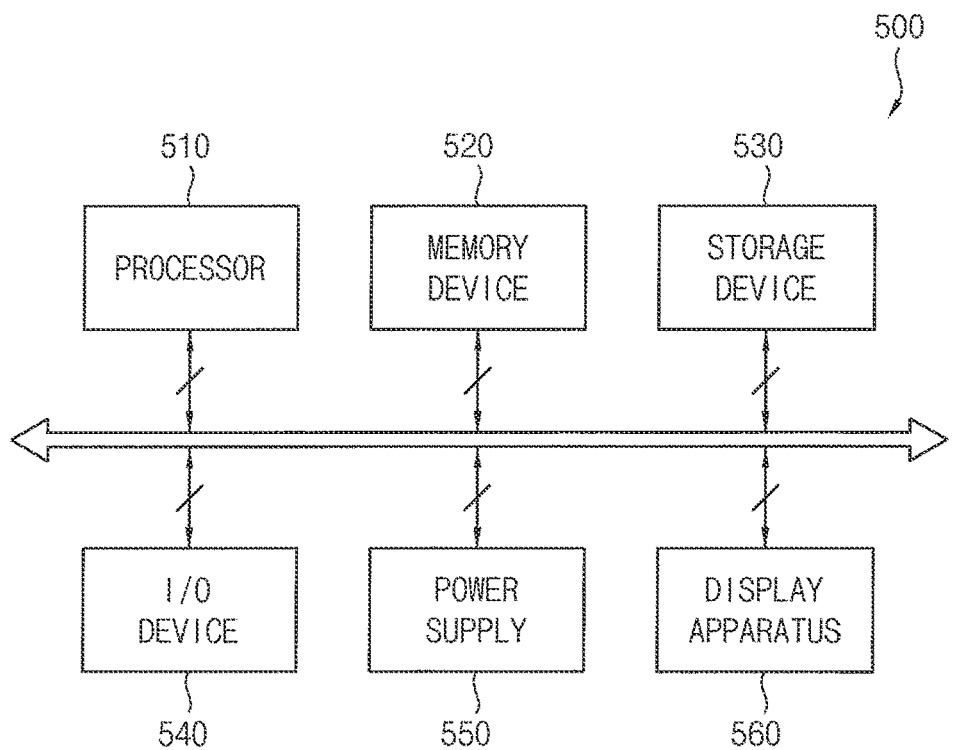
FIG. 16 is a block diagram illustrating an electronic device according to one or more example embodiments.
Figure 17A:
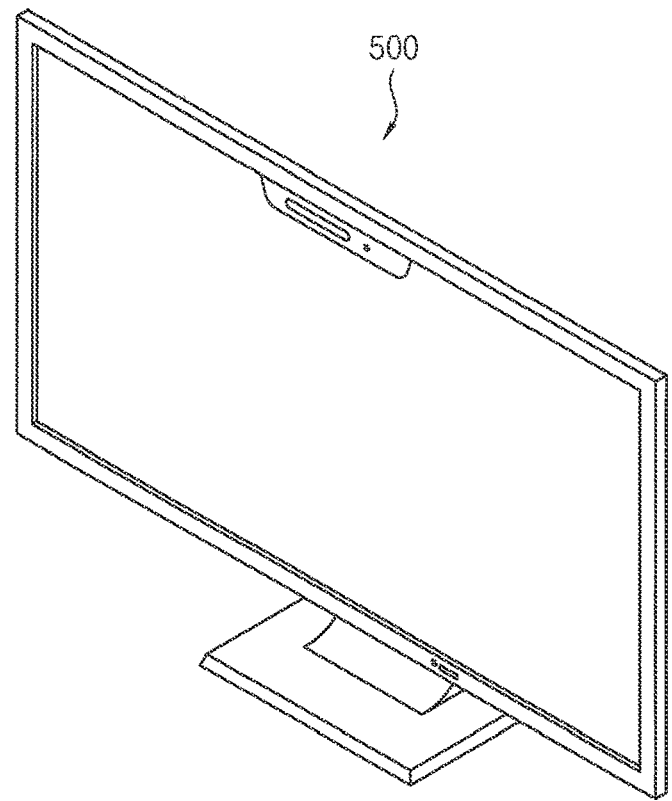
FIG. 17A is a diagram illustrating an example in which the electronic device of FIG. 16 is implemented as a television.
Figure 17B:
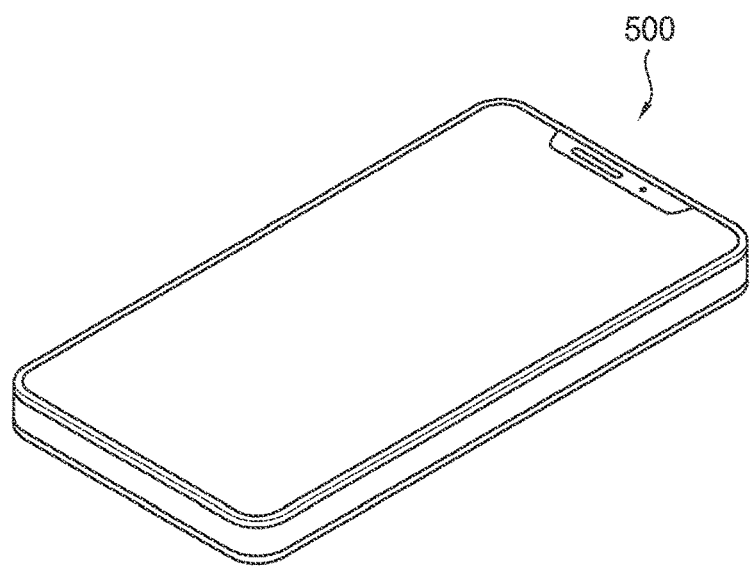
FIG. 17B is a diagram illustrating an example in which the electronic device of FIG. 16 is implemented as a smart phone.

FIG. 16 is a block diagram illustrating an electronic device according to one or more example embodiments, FIG. 17A is a diagram illustrating an example in which the electronic device of FIG. 16 is implemented as a television, and FIG. 17B is a diagram illustrating an example in which the electronic device of FIG. 16 is implemented as a smart phone.

Referring to FIGS. 16 to 17B, the electronic device 500 may include a processor 510, a memory device 520, a storage device 530, an input/output (I/O) device 540, a power supply 550, and a display apparatus 560. Here, the display apparatus 560 may be the display apparatus shown in FIG. 1. In addition, the electronic device 500 may further include a plurality of ports for communicating with a video card, a sound card, a memory card, a universal serial bus (USB) device, other electronic devices, and/or the like. In an embodiment, as illustrated in FIG. 17A, the electronic device 500 may be implemented as a television. In another embodiment, as illustrated in FIG. 17B, the electronic device 500 may be implemented as a smart phone. However, the present disclosure is not limited thereto, and the electronic device 500 may be implemented as any suitable device that uses or includes the display apparatus 560. For example, the electronic device 500 may be implemented as a cellular phone, a video phone, a smart pad, a smart watch, a tablet PC, a car navigation system, a computer monitor, a laptop, a head mounted display (HMD) apparatus, and/or the like.

The processor 510 may perform various computing functions. The processor 510 may be a microprocessor, a central processing unit (CPU), an application processor (AP), and/or the like. The processor 510 may be connected to other components via an address bus, a control bus, a data bus, and/or the like. Further, the processor 510 may be connected to an extended bus, for example, such as a peripheral component interconnection (PCI) bus. The memory device 520 may store data for operations of the electronic device 500. For example, the memory device 520 may include at least one non-volatile memory device, for example, such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, and/or the like, and/or at least one volatile memory device, for example, such as a dynamic random access memory (DRAM) device, a static random access memory (SRAM) device, a mobile DRAM device, and/or the like. The storage device 530 may include a solid state drive (SSD) device, a hard disk drive (HDD) device, a CD-ROM device, and/or the like. The I/O device 540 may include an input device, for example, such as a keyboard, a keypad, a mouse device, a touch-pad, a touch-screen, and/or the like, and an output device, for example, such as a printer, a speaker, and/or the like. The power supply 550 may provide power for operations of the electronic device 500.

The display apparatus 560 may be connected to other components via the buses and/or other communication links. In some embodiments, the I/O device 540 may include the display apparatus 560. As described above, the display apparatus 560 may include a base substrate, a thin film transistor and a power supply wire that are disposed on the base substrate, a first electrode disposed on the base substrate and electrically connected to the thin film transistor, a light emitting layer and a common layer that are disposed on the first electrode, and a second electrode disposed on the common layer. The power supply wire may include a first conductive layer, a second conductive layer disposed on the first conductive layer, and a third conductive layer disposed on the second conductive layer. The third conductive layer may protrude more than a side surface of the second conductive layer to form an undercut. The second electrode may contact (e.g., may directly contact) the side surface of the second conductive layer. Accordingly, in the display apparatus 560, the power supply wire, which may be an auxiliary wire, may be connected to the second electrode without a separate laser drilling process or a separate photo-process using a mask, so that the display apparatus capable of preventing or reducing the IR drop while reducing manufacturing costs, and having a simplified structure may be provided. Because these aspects and features of the present disclosure are described above, redundant description will not be repeated.

Example embodiments of the present disclosure may be applied to a display apparatus and an electronic device including the display apparatus. For example, one or more example embodiments of the present disclosure may be applied to a smart phone, a cellular phone, a video phone, a smart pad, a smart watch, a tablet PC, a car navigation system, a television, a computer monitor, a laptop, a head mounted display apparatus, and/or the like.

The foregoing is illustrative of example embodiments and is not to be construed as limiting thereof. Although some example embodiments have been described, those skilled in the art will readily appreciate that various modifications are possible in the example embodiments without materially departing from the spirit and scope of the present disclosure. Accordingly, all such modifications are intended to be included within the scope of the present disclosure as defined in the claims, and their equivalents. Therefore, it is to be understood that the foregoing is illustrative of various example embodiments and is not to be construed as limited to the specific embodiments disclosed, and that modifications to the disclosed embodiments, as well as other embodiments, are intended to be included within the spirit and scope of the appended claims, and their equivalents.

What is claimed is:

1. A method of manufacturing a display apparatus, the method comprising:
    sequentially forming a first conductive layer, a second conductive layer, and a third conductive layer on a base substrate;
    forming a power supply wire by patterning the third conductive layer, the second conductive layer, and the first conductive layer;
    forming a via insulating layer on the base substrate after the power supply wire is formed;
    forming a first electrode on the via insulating layer;
    forming a common layer on the base substrate on which the first electrode is formed; and
    forming a second electrode on the common layer,
    wherein the third conductive layer protrudes more than the second conductive layer at a side surface of the power supply wire, and
    wherein, when the second electrode is formed, the second electrode contacts a side surface of the second conductive layer.

2. The method of claim 1, wherein the first conductive layer includes titanium, the second conductive layer includes aluminum, and the third conductive layer includes titanium, and
    wherein, when the power supply wire is formed, the first to third conductive layers are patterned through dry etching to form an undercut.

3. The method of claim 1, wherein the first conductive layer includes titanium, the second conductive layer includes aluminum, and the third conductive layer includes titanium, and
    wherein, when the first electrode is formed, the first electrode is patterned through wet etching, and a portion of the second conductive layer is etched to form an undercut at side surfaces of the third conductive layer and the second conductive layer.

4. The method of claim 1, wherein the first conductive layer includes titanium, the second conductive layer includes copper, and the third conductive layer includes titanium, and
    wherein, when the power supply wire is formed, the first to third conductive layers are patterned through wet etching to form an undercut at side surfaces of the third conductive layer and the second conductive layer.

5. The method of claim 1, wherein, when the second electrode is formed, the second electrode is formed by depositing a conductive material in a direction inclined at an angle with respect to a direction perpendicular to the base substrate.

6. The method of claim 1, wherein the common layer contacts the side surface of the second conductive layer.

7. The method of claim 1, wherein the common layer comprises a hole injection layer, a hole transport layer, an electron transport layer, and an electron injection layer, and
    wherein the method further comprises forming a light emitting layer on the hole transport layer to overlap with the first electrode before forming the electron transport layer of the common layer.

* * * * *